(12) United States Patent
Bäßler et al.

(10) Patent No.: US 12,463,148 B2
(45) Date of Patent: Nov. 4, 2025

(54) POWER SEMICONDUCTOR MODULE WITH VIBRATION DAMPENERS AND POWER ELECTRONICS SYSTEM INCLUDING THE POWER SEMICONDUCTOR MODULE

(71) Applicant: Infineon Technologies AG, Neubiberg (DE)

(72) Inventors: Marco Bäßler, Oeversee (DE); Michael Niendorf, Verl (DE)

(73) Assignee: Infineon Technologies AG, Neubiberg (DE)

( * ) Notice: Subject to any disclaimer, the term of this patent is extended or adjusted under 35 U.S.C. 154(b) by 463 days.

(21) Appl. No.: 18/107,257

(22) Filed: Feb. 8, 2023

(65) Prior Publication Data
US 2024/0266300 A1    Aug. 8, 2024

(51) Int. Cl.
*H01L 25/065* (2023.01)
*H01L 23/00* (2006.01)
(Continued)

(52) U.S. Cl.
CPC ........ *H01L 23/562* (2013.01); *H01L 23/4952* (2013.01); *H01L 23/49575* (2013.01); *H01L 23/49861* (2013.01); *H05K 1/18* (2013.01); *H01L 23/3121* (2013.01); *H01L 23/4006* (2013.01); *H01L 2023/4087* (2013.01);
(Continued)

(58) Field of Classification Search
CPC ............... H01L 23/562; H01L 23/4952; H01L 23/49575; H01L 23/49861; H01L 23/3121; H01L 23/4006; H01L 23/053; H01L 24/48; H01L 25/0655; H01L 25/072; H05K 1/18; H02M 7/003
See application file for complete search history.

(56) References Cited

U.S. PATENT DOCUMENTS 9,736,925 B2    8/2017  Ziglioli
10,403,601 B2   9/2019  Im et al.
(Continued)

FOREIGN PATENT DOCUMENTS

| CN | 105703631 A | 6/2016 |
|---|---|---|
| CN | 215578506 U | 1/2022 |
| DE | 102020208438 A1 | 1/2022 |

*Primary Examiner* — Omar F Mojaddedi
(74) *Attorney, Agent, or Firm* — Murphy, Bilak & Homiller, PLLC

(57) ABSTRACT

A power semiconductor module includes: an electrically insulative enclosure; a plurality of power semiconductor dies attached to a substrate inside the electrically insulative enclosure; a lead frame or clip frame disposed above the power semiconductor dies inside the electrically insulative enclosure and electrically connected to the power semiconductor dies; a plurality of contact pins attached to the lead frame or clip frame and protruding through a first side of the electrically insulative enclosure to form an electrical connection interface outside the electrically insulative enclosure; and a plurality of vibration dampeners attached to the lead frame or clip frame. The vibration dampeners protrude through the first side of the electrically insulative enclosure and are separate from the electrical connection interface. The vibration dampeners are configured to dampen vibrations at a circuit board designed to be mounted to the module and do not affect electrical operation of the power semiconductor module.

17 Claims, 12 Drawing Sheets

(51) Int. Cl.
*H01L 23/31* (2006.01)
*H01L 23/495* (2006.01)
*H01L 23/498* (2006.01)
*H01L 25/07* (2006.01)
*H02M 7/00* (2006.01)
*H05K 1/18* (2006.01)
*H01L 23/40* (2006.01)

(52) U.S. Cl.
CPC .......... *H01L 24/48* (2013.01); *H01L 25/0655* (2013.01); *H01L 25/072* (2013.01); *H01L 2224/48137* (2013.01); *H01L 2224/48175* (2013.01); *H05K 2201/09063* (2013.01); *H05K 2201/09409* (2013.01); *H05K 2201/1059* (2013.01)

(56) References Cited

U.S. PATENT DOCUMENTS

| | | |
|---|---|---|
| 11,037,856 B2 | 6/2021 | Neugirg et al. |
| 11,075,137 B2 | 7/2021 | Lin et al. |
| 2014/0003013 A1* | 1/2014 | Yoo .................. H01L 23/49861 361/767 |
| 2017/0271239 A1* | 9/2017 | Morozumi .............. H01L 23/42 |
| 2019/0189553 A1* | 6/2019 | Hohlfeld ............... H01L 25/072 |
| 2019/0295929 A1* | 9/2019 | Takagi .............. H01L 23/49575 |
| 2020/0350236 A1* | 11/2020 | Umeda ............... H01L 23/3735 |
| 2021/0313296 A1 | 10/2021 | Raimann et al. |
| 2021/0344276 A1 | 11/2021 | Raimann et al. |
| 2023/0215788 A1* | 7/2023 | Luo ........................ H01L 24/73 257/676 |

* cited by examiner

POWER SEMICONDUCTOR MODULE WITH VIBRATION DAMPENERS AND POWER ELECTRONICS SYSTEM INCLUDING THE POWER SEMICONDUCTOR MODULE

BACKGROUND

Power semiconductor modules are designed for power electronics applications and are widely used across many industries, including electric vehicles, appliances, industrial drives, general purpose drives, traction, servo-units, renewable energy applications like solar inverters or wind applications, etc. A printed circuit board (PCB) is typically mounted to a power semiconductor module, the PCB including additional electronic components such as a controller, gate driver, etc. for the electronic components included in the power semiconductor module. However, PCBs have one or more vibration modes that need to be controlled. The PCB vibration modes depend on several variables, including the composition and size of the PCB, the type of circuitry mounted to the PCB, etc. Absent adequate vibration control, PCB movement can lead to failure or other problems within the power electronics system.

Hence, there is a need form an improved interface between power semiconductor modules and PCBs that reduces PCB vibration.

SUMMARY

According to an embodiment of a power semiconductor module, the power semiconductor module comprises: an electrically insulative enclosure; a plurality of power semiconductor dies attached to a substrate inside the electrically insulative enclosure; a lead frame or clip frame disposed above the plurality of power semiconductor dies inside the electrically insulative enclosure and electrically connected to the plurality of power semiconductor dies; a plurality of contact pins attached to the lead frame or clip frame and protruding through a first side of the electrically insulative enclosure to form an electrical connection interface outside the electrically insulative enclosure; and a plurality of vibration dampeners attached to the lead frame or clip frame and protruding through the first side of the electrically insulative enclosure separate from the electrical connection interface, wherein the plurality of vibration dampeners is configured to dampen vibrations at a circuit board designed to be mounted to the power semiconductor module and does not affect electrical operation of the power semiconductor module.

According to an embodiment of a power electronics system, the power electronics system comprises: a power semiconductor module that includes an electrically insulative enclosure, a plurality of power semiconductor dies attached to a substrate inside the electrically insulative enclosure, a lead frame or clip frame disposed above the plurality of power semiconductor dies inside the electrically insulative enclosure and electrically connected to the plurality of power semiconductor dies, a plurality of pins attached to the lead frame or clip frame and protruding through a first side of the electrically insulative enclosure to form an electrical connection interface outside the electrically insulative enclosure, and a plurality of vibration dampeners attached to the lead frame or clip frame and protruding through the first side of the electrically insulative enclosure separate from the electrical connection interface; and a circuit board that includes a plurality of electronic components mounted thereon, a plurality of first openings that receive the plurality of pins, and a plurality of second openings that receive the plurality of vibration dampeners, wherein the plurality of vibration dampeners is configured to dampen vibrations at the circuit board and does not affect electrical operation of the power semiconductor module.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

The embodiments described herein provide a power semiconductor module with a vibration dampening feature that reduces vibration at a circuit board designed to be mounted to the power semiconductor module. The vibration dampening feature is configured to dampen vibrations at the circuit board without affecting electrical operation of the power semiconductor module.

Described next, with reference to the figures, are exemplary embodiments of a power semiconductor module with the vibration dampening feature and power electronics systems that include the power semiconductor module. Any of the vibration dampening feature embodiments described herein may be used interchangeably unless otherwise expressly stated.

Figure 1:
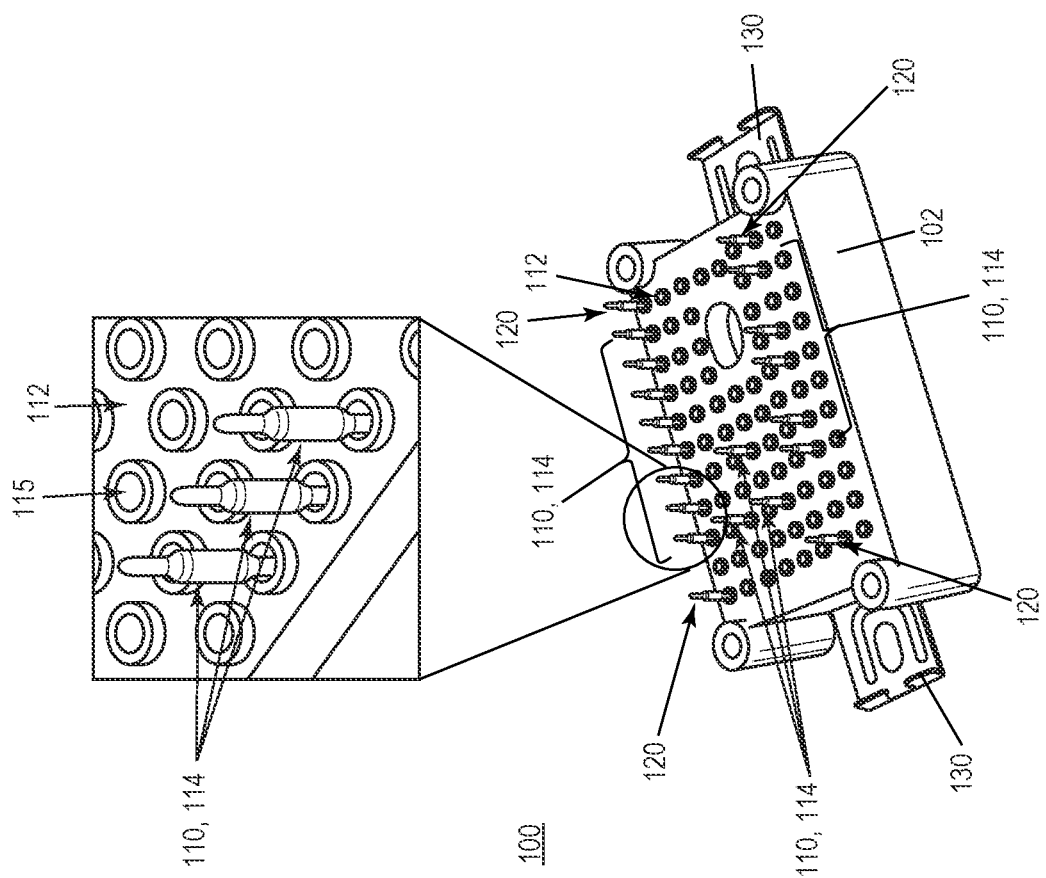
FIG. 1 illustrates a top perspective view of an embodiment of a power semiconductor module having vibration dampeners.
Figure 2:
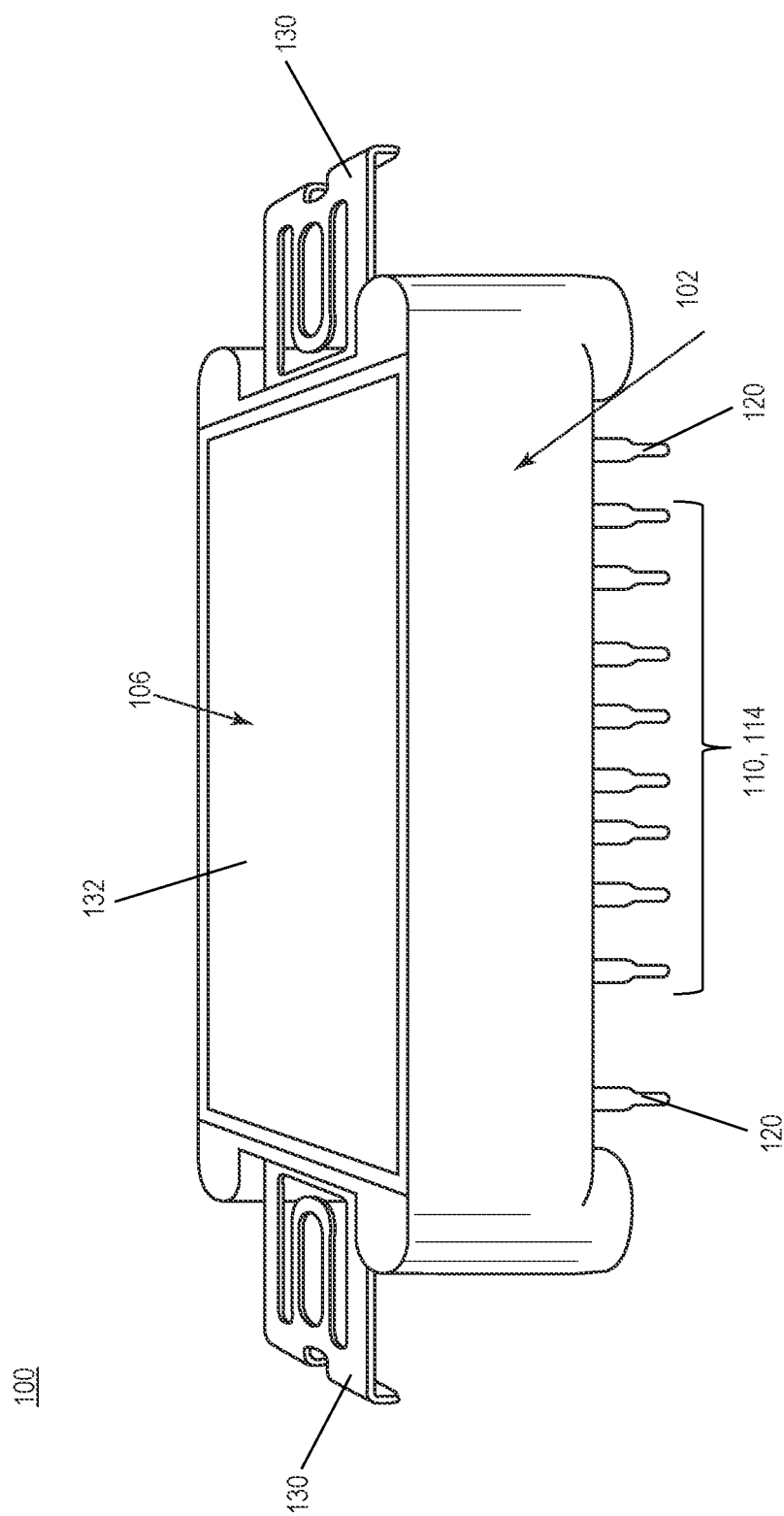
FIG. 2 illustrates a bottom perspective view of the power semiconductor module.
Figure 3:
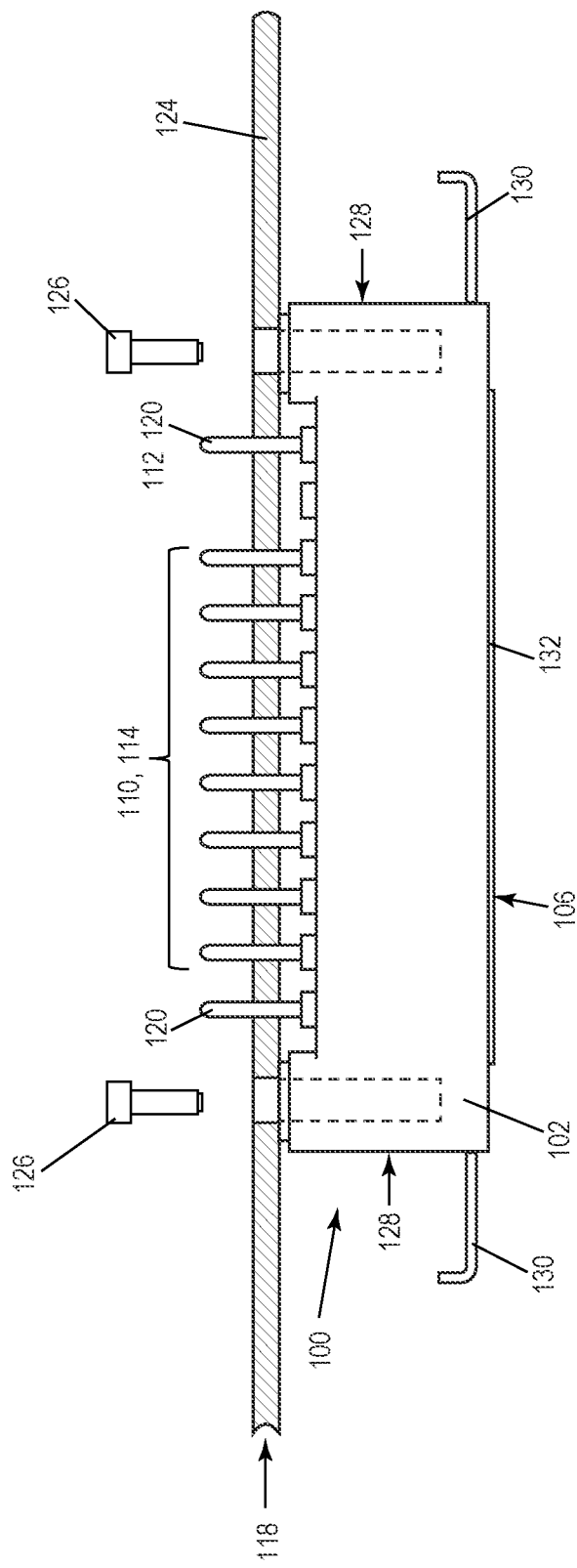
FIG. 3 illustrates a side perspective view of the power semiconductor module.

FIG. 1 illustrates a top perspective view of an embodiment of a power semiconductor module 100. FIG. 2 illustrates a bottom perspective view of the power semiconductor module 100. FIG. 3 illustrates a side perspective view of the power semiconductor module 100.

The power semiconductor module 100 may form part of a power electronics circuit for use in various power applications such as in a DC/AC inverter, a DC/DC converter, an AC/DC converter, a DC/AC converter, an AC/AC converter, a multi-phase inverter, an H-bridge, etc. The power semiconductor module 100 includes an electrically insulative enclosure 102 such as a plastic housing. Power semiconductor dies 104 are attached to a substrate 106 inside the electrically insulative enclosure 102. A lead frame or clip frame 108 is disposed above the power semiconductor dies 104 inside the electrically insulative enclosure 102 and electrically connected to the power semiconductor dies 104. The semiconductor dies 104 and the lead frame or clip frame 108 are out of view in FIGS. 1 through 3.

The substrate 106 may be, e.g., a DCB (direct copper bonded) substrate, an AMB (active metal brazed) substrate, an IMS (insulated metal substrate), etc. The semiconductor dies 104 may be power Si or SiC power MOSFET (metal-oxide-semiconductor field-effect transistor) dies, HEMT (high-electron mobility transistor) dies, IGBT (insulated-gate bipolar transistor) dies, JFET (junction filed-effect transistor) dies, etc. The semiconductor dies 104 may be vertical power transistor dies. For a vertical power transistor die, the primary current flow path is between the front and back sides of the die. The drain pad is typically disposed at the backside of the die 104, with the gate and source pads (and optionally one or more sense pads) at the frontside of the die 104. Additional types of semiconductor dies may be included in the power semiconductor module 100, e.g., such as one or more power diode dies, logic dies, controller dies, gate driver dies, etc.

The power semiconductor module 100 also includes contact pins 110 attached to the lead frame or clip frame 108 and protruding through a first side 112 of the electrically insulative enclosure 102 to form an electrical connection interface 114 outside the electrically insulative enclosure 102. For example, the contact pins 110 may extend through openings 115 in the first side 112 of the electrically insulative enclosure 102.

The electrical connection interface 114 formed by the contact pins 110 provides an electrical interface to the power semiconductor dies 104 housed in the electrically insulative enclosure 102. In one embodiment, the contact pins 110 that form the electrical connection interface 114 are press-fit pins. Press-fit pins have a pin geometry that enables plastic deformation in an upper region of the pin. After insertion into an opening in a metallization such as the metallization 116 of a circuit board 118 such as a PCB, contact between the pin 110 and the metallization 118 develops and elastic and plastic deformations generate a large contact area.

The power semiconductor module 100 further includes vibration dampeners 120 attached to the lead frame or clip frame 108 and protruding through the first side 112 of the electrically insulative enclosure 102 separate from the electrical connection interface 114. For example, the vibration dampeners 120 may extend through openings 115 in the first side 112 of the electrically insulative enclosure 102.

The vibration dampeners 120 are configured to dampen vibrations at the circuit board 118 which is designed to be mounted to the power semiconductor module 100, e.g., as shown in FIG. 3. The power semiconductor module 100 and the circuit board 118 form a power electronics system such as DC/AC inverter, a DC/DC converter, an AC/DC converter, a DC/AC converter, an AC/AC converter, a multi-phase inverter, an H-bridge, etc.

The vibration dampeners 120 do not affect electrical operation of the power semiconductor module 100. The electrical connection interface 114 formed by the contact pins 110 affects the electrical operation of the power semiconductor module 100 and the vibration dampeners 120 do not form part of the electrical connection interface 114.

Accordingly, the vibration dampeners 120 do not provide power or signals to the power semiconductor dies 104 housed in the electrically insulative enclosure 102.

One or more of the vibration dampeners 120 may be at an electric potential since the vibration dampeners 120 are attached to the lead frame or clip frame 108. However, no vibration dampener 120 at an electric potential carries current. Instead, the vibration dampeners 120 are arranged to suppress vibrations of the circuit board 118 mounted to the first side 112 of the electrically insulative enclosure 102 of the power semiconductor module 100. The pattern/layout of the vibration dampeners 120 depends on the vibration mode (s) of the circuit board 118 to be dampened. Each circuit board vibration mode in turn depends on several variables such as the composition and size of the circuit board 118, the type of circuitry mounted to the circuit board 118, etc. According to the power module embodiment illustrated in FIGS. 1 through 3, the vibration dampeners 120 that dampen vibrations at the circuit board 118 are pins such as press-fit pins.

Figure 4:
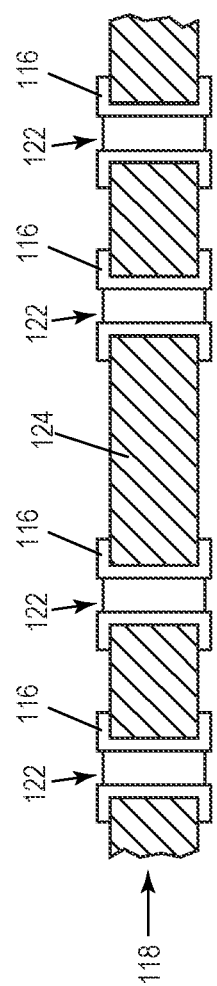
FIG. 4 illustrates a partial cross-sectional view of a circuit board designed to be mounted to the power semiconductor module.

FIG. 4 illustrates a partial cross-sectional view of the circuit board 118 designed to be mounted to the power semiconductor module 100. Openings 122 are formed in an electrically insulating body 124 of the circuit board 118. The electrically insulating body 124 may include pre-peg materials (pre impregnated fibre) such as FR-2, FR-4, CEM-1, G-10, etc., e.g., in the case of a PCB. The openings 122 in the electrically insulating body 124 may be coated with a metallization 116. In the case of pins as the vibration dampeners 120, the contact pins 110 and the vibration dampeners 120 of the power semiconductor module 100 are inserted into the circuit board openings 122 during mounting of the circuit board 118 to the module 100. In the case of press-fit pins as the vibration dampeners 120, a first press-fit connection is formed between the contact pins 110 of the power semiconductor module 100 and the openings 122 in the circuit board 118 that receive the contact pins 110 and a second press-fit connection is formed between the vibration dampeners 120 of the module 100 and the openings 122 in the circuit board 118 that receive the vibration dampeners 120. The circuit board 118 may be mounted to the power semiconductor module 100 by one or more fasteners 126 such as screws, bolts, rivets, etc., by an adhesive, by plastic welding, by clamping, etc.

Part of the lead frame or clip frame 108 included in the power semiconductor module 100 may protrude through one or more side faces 128 of the electrically insulative enclosure 102 to form a power terminal 130 of the power semiconductor module 100. The power terminal may provide a reference voltage to the power semiconductor module 100 or carry current to or from the power semiconductor module 100.

Figure 5:
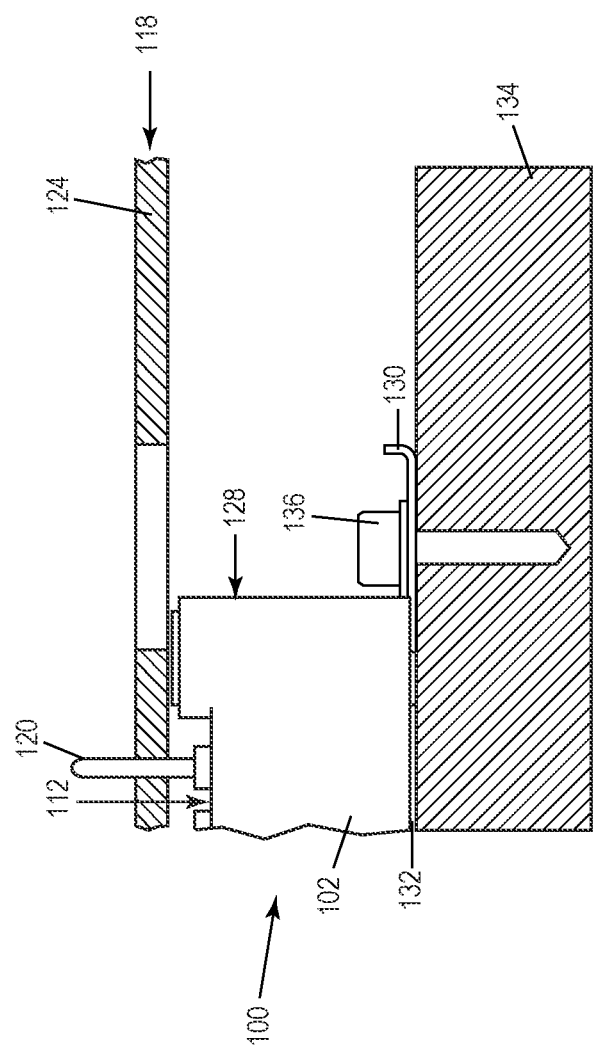
FIG. 5 illustrates a partial cross-sectional view of the power semiconductor module with a heatsink mounted to a metallized backside of the module.

The substrate 106 inside the electrically insulative enclosure 102 of the power semiconductor module 100 and to which the power semiconductor dies 104 are attached may have a metallized backside 132 that faces away from the circuit board 118, e.g., in the case of a DCB, AMB or IMS substrate. According to this embodiment, a heatsink 134 may be mounted to the metallized backside 132 of the power semiconductor module 100 as shown in the partial cross-sectional view of FIG. 5. For example, the heatsink 134 may be mounted to the metallized backside 132 of the power semiconductor module 100 by one or more fasteners 136 such as screws, bolts, rivets, etc. inserted through an opening in the power terminals 130 of the module 100 and into the heatsink 134.

Figure 6:
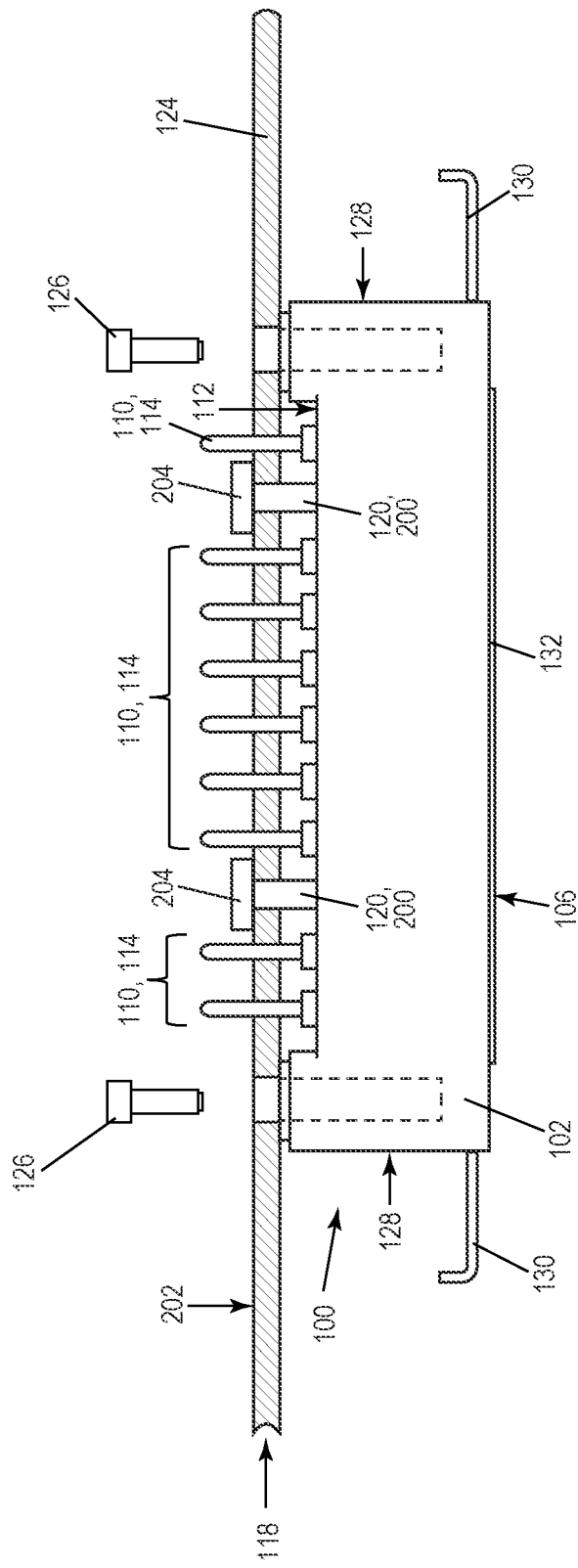
FIG. 6 illustrates a side perspective view of the power semiconductor module, according to another embodiment.

FIG. 6 illustrates a side perspective view of the power semiconductor module 100, according to another embodiment. In FIG. 6, the vibration dampeners 120 are electrically insulative protuberances 200 that jut out from the first side 112 of the electrically insulative enclosure 102. For example, the electrically insulative protuberances 200 may be formed as part of the electrically insulative enclosure 102, e.g., by an injection molding or similar process. The electrically insulative protuberances 200 instead may be (plastic) welded to the electrically insulative enclosure 102. The electrically insulative protuberances 200 are received by corresponding openings 122 in the circuit board 118 mounted to the power semiconductor module 100. The electrically insulative protuberances 200 are (plastic) welded to the circuit board 118 at a side 202 of the circuit board 118 that faces away from the power semiconductor module 100, e.g., by applying heat and pressure to deform the distal (free) end of the electrically insulative protuberances 200 followed by cooling to form a plastic weld 204.

Figure 7:
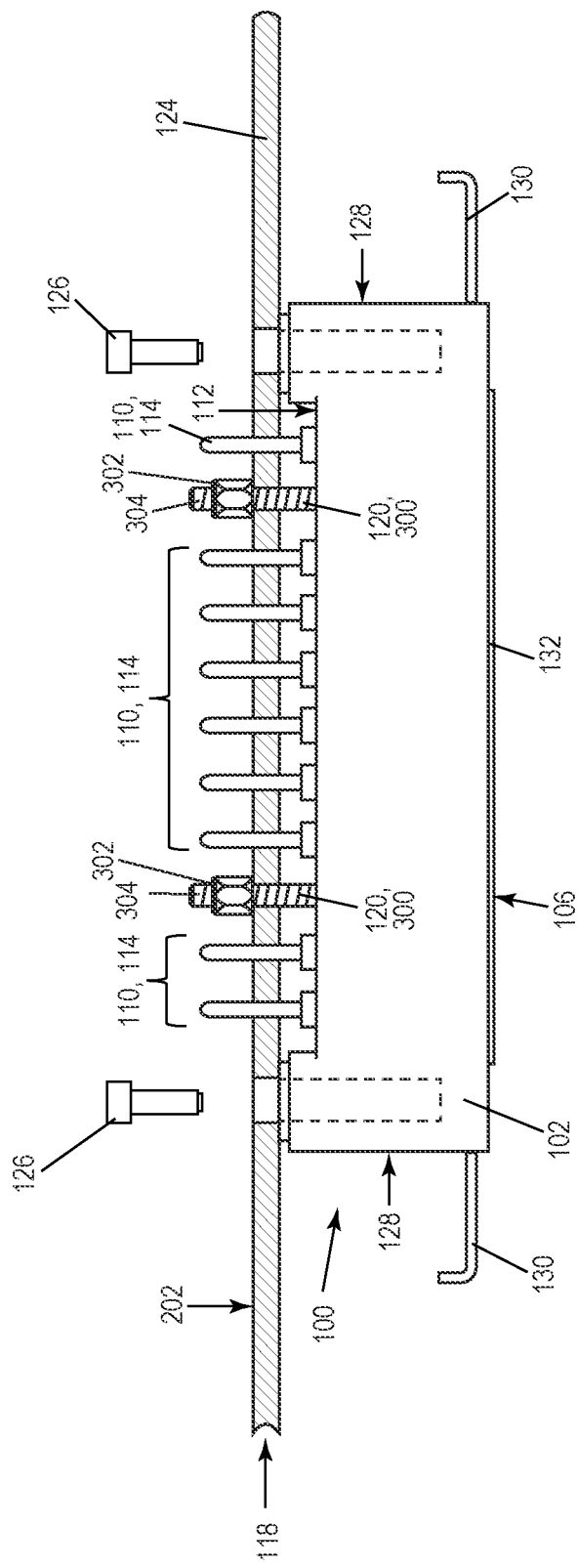
FIG. 7 illustrates a side perspective view of the power semiconductor module, according to another embodiment.

FIG. 7 illustrates a side perspective view of the power semiconductor module 100, according to another embodiment. In FIG. 6, the vibration dampeners 120 are screw-type fasteners 300 attached to the lead frame or clip frame 108 included in the power semiconductor module 100 and that protrude through the first side 112 of the electrically insulative enclosure 102 to form a screw connection with the corresponding openings 122 in the circuit board 118. For example, a nut or similar type of fastener 302 may be secured to the distal (free) end 304 of the screw-type fasteners 300 to form the screw connection with the corresponding openings 122 in the circuit board 118.

Figure 8:
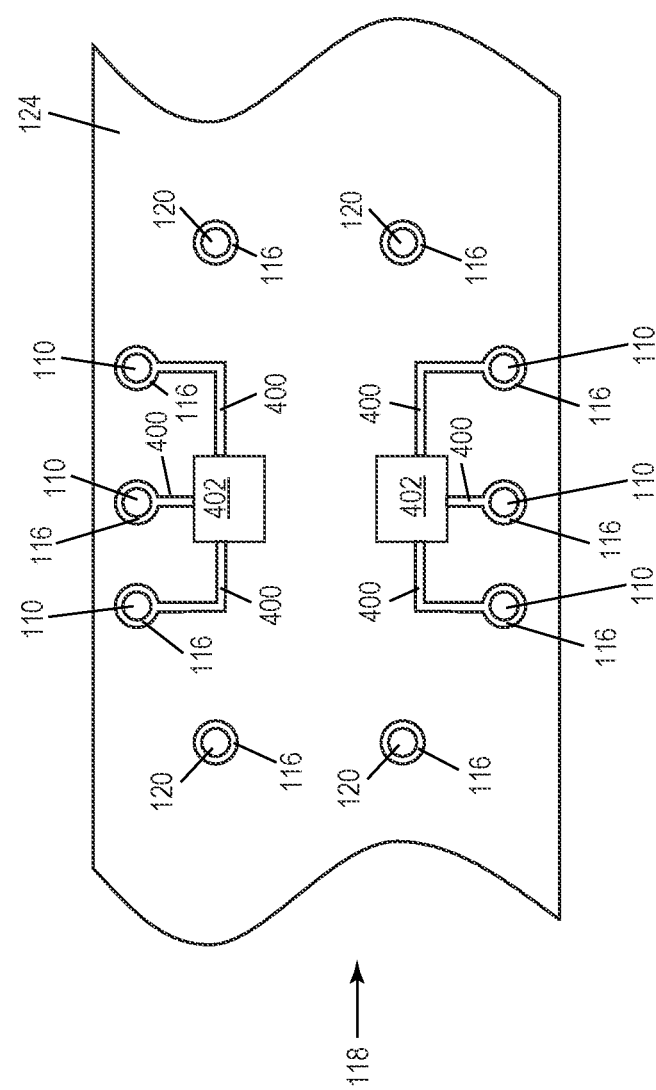
FIG. 8 through 10 illustrate respective partial top plan views of the circuit board designed to be to the power semiconductor module, for different embodiments of the vibration dampeners.

FIG. 8 illustrates a partial top plan view of the circuit board 118 designed for mounting to the power semiconductor module 100. In FIG. 8, the circuit board 118 has metal traces 400 that electrically interconnect the contact pins 110 of the power semiconductor module 100 to one or more electronic components 402 mounted on the circuit board 118. The electronic component(s) 402 mounted on the circuit board 118 may be passive and/or active components such as resistor(s), capacitor(s), inductor(s), controller, gate driver, etc. In the case of the pin-type vibration dampeners 120 shown in FIGS. 1-3 and 5, the vibration dampeners 120 are electrically insulated from the metal traces 400 of the circuit board 118 in FIG. 8.

Figure 9:
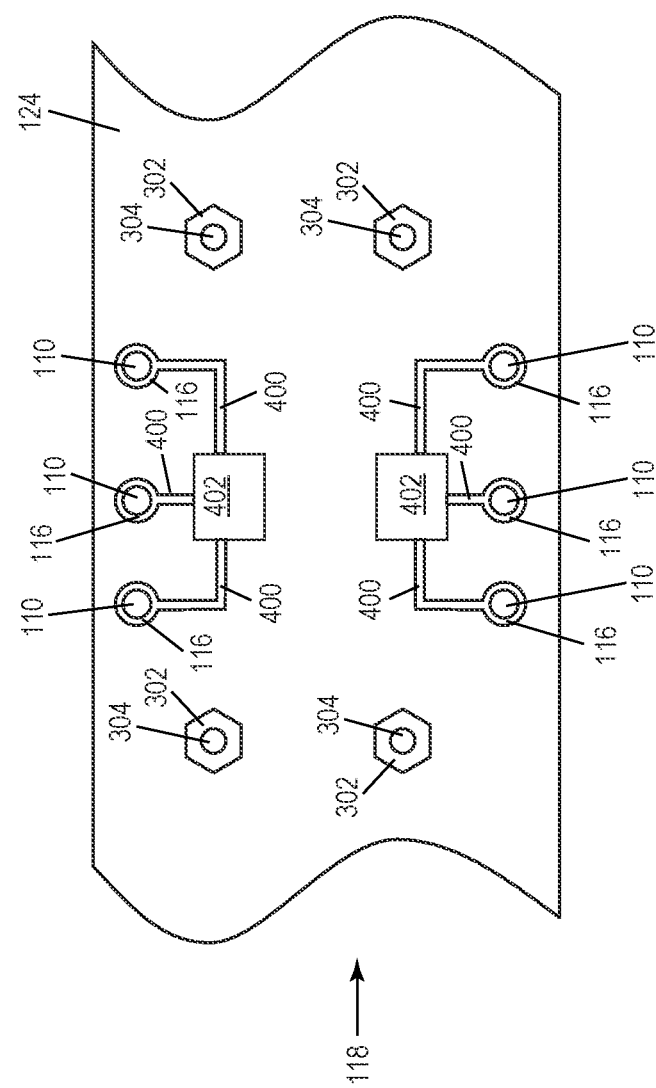

FIG. 9 illustrates the same partial top plan view of the circuit board 118 as FIG. 8, but for the screw-type insulative vibration dampeners 300 shown in FIG. 7.

Figure 10:
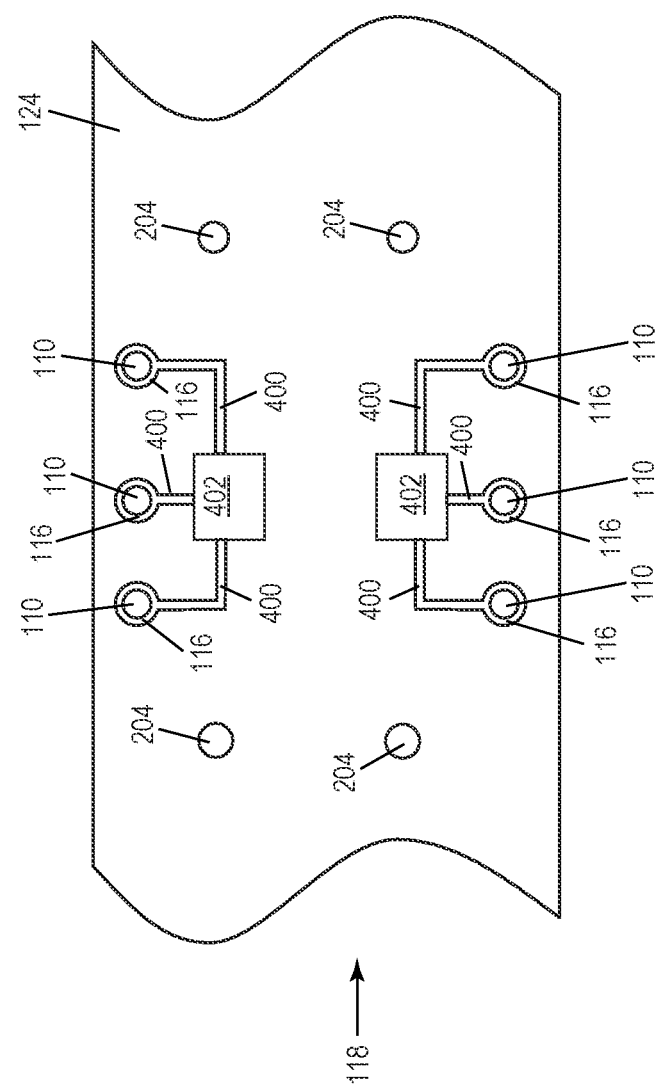

FIG. 10 illustrates the same partial top plan view of the circuit board 118 as FIG. 8, but for the electrically insulative vibration dampeners 200 shown in FIG. 6.

Figure 11:
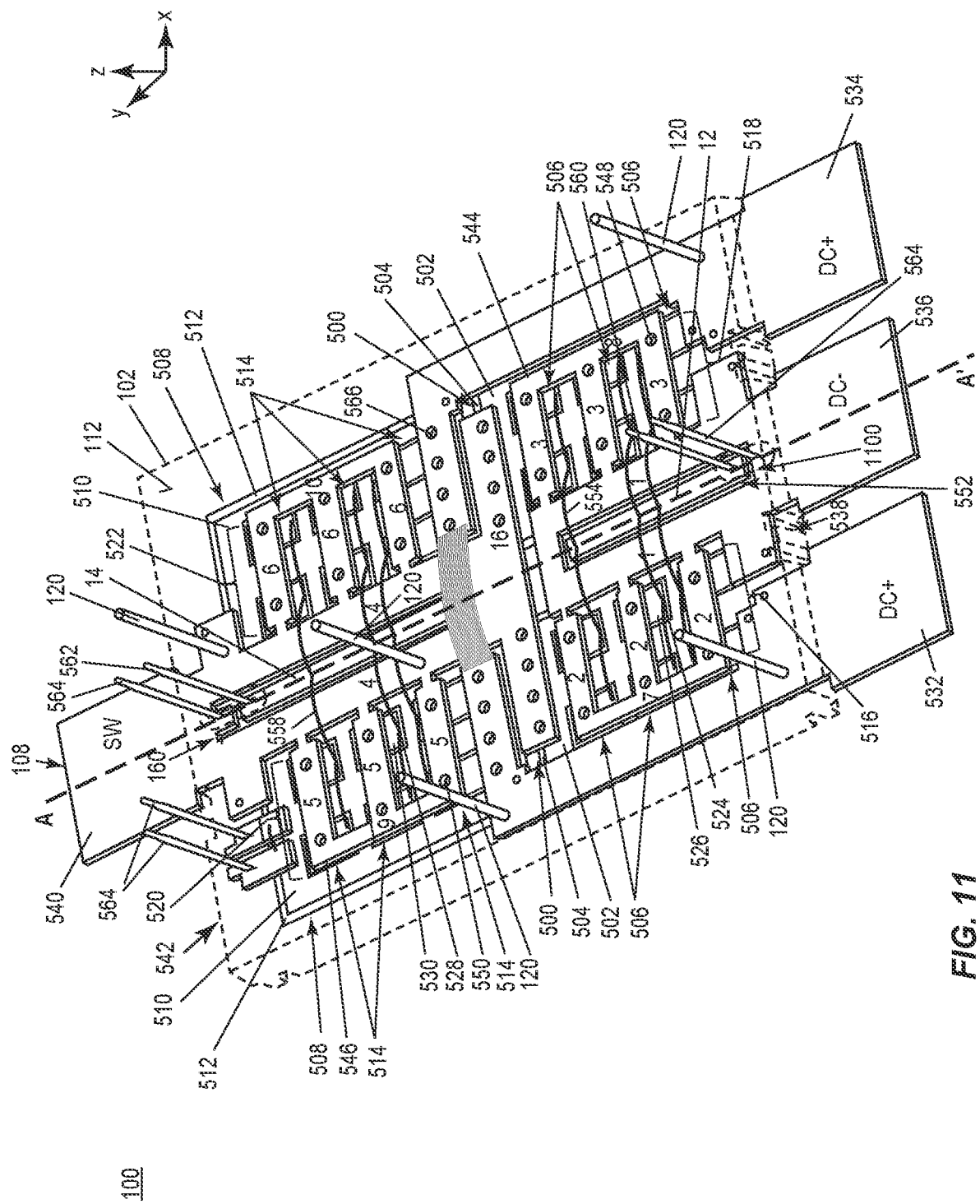
FIG. 11 illustrates a top perspective view of the power semiconductor module, according to another embodiment.

FIG. 11 illustrates a top perspective view of the power semiconductor module 100, according to another embodiment. In FIG. 11, at least one first power electronics carrier 500 has a metallization layer 502 disposed on an electrically insulating substrate 504. First power semiconductor dies 506 are attached to the metallization layer 502 of the at least one first power electronics carrier 500. At least one second power electronics carrier 508 having a metallization layer 510 disposed on an electrically insulating substrate 512. Second power semiconductor dies 514 are attached to the metallization layer 510 of the at least one second power electronics carrier 508. The electrically insulative enclosure 102 encases the first power semiconductor dies 506 and the second power semiconductor dies 514, and at least partly encases the at least one first power electronics carrier 500 and the at least one second power electronics carrier 508. In one embodiment, the surface (out of view in FIG. 11) of the first and second power electronics carriers 500, 508 opposite the respective metallization layers 502, 510 is exposed from the electrically insulative enclosure 102 to provided single-sided cooling of the power semiconductor module 100, e.g., as shown in FIGS. 2, 3, and 5-7.

The outline of the electrically insulative enclosure 102 is shown in FIG. 11 to provide an unobstructed view of the elements enclosed within the electrically insulative enclosure 102. The at least one first power electronics carrier 500 and the at least one second power electronics carrier 508 are positioned aside one another in the x-y plane instead of being vertically stacked one on top of the other in the z direction.

The first power semiconductor dies 506 may be attached to the metallization layer 502 of a single first power electronics carrier 500, with a first subset 516 and a second subset 518 of the first power semiconductor dies 506 being symmetrically arranged on the single first power electronics carrier 500 about a longitudinal centerline A-A' of the power semiconductor module 100. The second power semiconductor dies 514 similarly may be attached to the metallization layer 510 of a single second power electronics carrier 508, with a first subset 520 and a second subset 522 of the second power semiconductor dies 514 also being symmetrically arranged on the single second power electronics carrier 508 about the longitudinal centerline A-A' of the power semiconductor module 100.

The first and second subsets 516, 518 of the first power semiconductor dies 506 instead may be attached to separate first power electronics carriers 500, with the separate first power electronics carriers 506 being arranged symmetrically with respect to one another about the longitudinal centerline A-A' of the power semiconductor module 100. The first and second subsets 520, 522 of the second power semiconductor dies 514 similarly may be attached to separate second power electronics carriers 508, with the separate second power electronics carriers 508 also being arranged symmetrically with respect to one another about the longitudinal centerline A-A' of the power semiconductor module 100.

In the example illustrated in FIG. 11, the first power semiconductor dies 506 are arranged symmetrically about the package longitudinal centerline A-A' in three rows (x-direction) with four (two on each side of the longitudinal centerline A-A') first power semiconductor dies 506 in each row. The second power semiconductor dies 514 are also arranged symmetrically about the package longitudinal centerline A-A' in three rows (x-direction) with four (two on each side of the longitudinal centerline A-A') second power semiconductor dies 514 in each row. More generally, the power semiconductor module 100 may include at least two first power semiconductor dies 506 and at least two second power semiconductor dies 514, with an equal number of first power semiconductor dies 506 and an equal number of second power semiconductor dies 514 being arranged on both sides of the longitudinal centerline A-A' of the module 100. This ensures a symmetric layout of both the power semiconductor dies 506, 514 and the power electronics carriers 500, 508 within the electrically insulative enclosure 102 of the module 100.

The first power semiconductor dies 506 and the second power semiconductor dies 514 may be electrically interconnected as a half bridge inside the electrically insulative enclosure 102 by the lead frame or clip frame 108 and the substrate formed by the power electronics carriers 500, 508, with the first power semiconductor dies 506 forming a low-side switch of the half bridge and the second power semiconductor dies 514 forming a high-side switch of the half bridge. According to this embodiment, one or more of the electronic components 402 mounted on the circuit board 118 designed for the power semiconductor module 100 includes a gate driver for the low-side switch device and/or high-side switch device.

For the vertical die arrangement shown in FIG. 11, the drain pad (out of view in FIG. 11) of each first power semiconductor die 506 is connected to the metallization layer 502 of the at least one first power electronics carrier 500 with gate and source pads 524, 526 (and optionally one or more sense pads) at the opposite frontside of the first dies 506. The drain pad (out of view in FIG. 11) of each second power semiconductor die 514 is similarly connected to the metallization layer 510 of the at least one second power electronics carrier 508 with gate and source pads 528, 530 (and optionally one or more sense pads) at the opposite frontside of the second dies 514.

At least one lead 532, 534, 536 protrudes from a first side face 538 of the electrically insulative enclosure 102 and at least one lead 540 protrudes from a second side face 542 of the electrically insulative enclosure 102 opposite the first side face 538. The longitudinal centerline A-A' of the power semiconductor module 100 extends between the first and second side faces 538, 542 of the electrically insulative enclosure 102.

In FIG. 11, two high-side phase or power leads 532, 534 protrude from the first side face 538 of the electrically insulative enclosure 102 to provide a power/phase connection 'DC+' to the second (high-side) power semiconductor dies 514. The first high-side phase/power lead 532 provides the DC+ power/phase connection to the first subset 520 of the second power semiconductor dies 514 and the second high-side phase/power lead 534 provides the DC+ power/phase connection to the second subset 522 of the second power semiconductor dies 514. A low high-side phase/ground lead 536 also protrudes from the first side face 538 of the electrically insulative enclosure 102 and provides a power/phase connection 'DC−' to the first (low-side) power semiconductor dies 506. The low-side phase/ground lead 536 is interposed between the first and second high-side phase/power leads 532, 534.

A switch node lead 540 protrudes from the second side face 542 of the electrically insulative enclosure 102 and is electrically connected to the switch node 'SW' between the high-side power semiconductor dies 514 and the low-side power semiconductor dies 506 of the half bridge. In this case, the switch node lead 540 is the output lead for the power semiconductor module 100.

The internal electrical connections between the package leads 532, 534, 536, 540 and the power semiconductor dies 506, 514 enclosed in the electrically insulative enclosure 102 may be provided by the lead frame or clip frame 108 overlying the power semiconductor dies 506, 514. In FIG. 11, the lead frame or clip frame 108 includes a first structured metal frame 544 disposed above the at least one first power electronics carrier 500 and a second structured metal frame 546 disposed above the at least one second power electronics carrier 508. The features of the structured metal frames 544, 546 may be formed by stamping, punching, etching, etc.

In FIG. 11, both the first structured metal frame 544 and the second structured metal frame 546 are symmetric about the longitudinal centerline A-A' of the power semiconductor module 100. The terms 'symmetric' and 'symmetrical' as used herein include unavoidable asymmetry which may arise due to manufacturing tolerances. However, asymmetry may be intentionally introduced into the lead frame or clip frame 108. For example, all semiconductor dies 506, 514 may face the same direction which can introduce a minor asymmetry in the lead frame or clip frame 108 relative to the centerline A-A' of the power semiconductor module 100.

In either case, the first structured metal frame 544 is electrically connected to the source pad 526 of each first (low-side) power semiconductor die 506, e.g., by bumps or stamped features 548 at the backside of the first structured metal frame 544, or by solder, electrically conductive adhesive, etc. The second structured metal frame 546 is electrically connected to the source pad 530 of each second (high-side) power semiconductor die 514, e.g., by bumps or stamped features 550 at the backside of the second structured metal frame 546, or by solder, electrically conductive adhesive, etc.

A first subset 516 and a second subset 518 of the first power semiconductor dies 506 may be arranged on opposite sides of the longitudinal centerline A-A' of the power semiconductor module 100, as previously described herein. A first subset 520 and a second subset 522 of the second power semiconductor dies 514 similarly may be arranged on opposite sides of the longitudinal centerline A-A'.

As shown in FIG. 11, the first structured metal frame 544 may include a first central part '1' that extends along the longitudinal centerline A-A'. First branches '2' each joined at a proximal end to the first central part '1' extend in parallel over the first subset 516 of first power semiconductor dies 506 in a first lateral direction (−x direction in FIG. 1) that is transverse to the longitudinal centerline A-A'. Second branches '3' each joined at a proximal end to the first central part '1' extend in parallel over the second subset 518 of first power semiconductor dies 514 in a second lateral direction (x direction in FIG. 1) opposite the first lateral direction.

Further as shown in FIG. 11, the second structured metal frame 546 includes a second central part '4' that extends along the longitudinal centerline A-A'. Third branches '5' each joined at a proximal end to the second central part '4' extend in parallel over the first subset 520 of second power semiconductor dies 514 in the first lateral direction. Fourth branches '6' each joined at a proximal end to the second central part '4' extend in parallel over the second subset 522 of second power semiconductor dies 514 in the second lateral direction.

The first branches '2' of the lead frame or clip frame 108 are vertically connected to the source pad 526 of each power semiconductor die 506 included in the first subset 516 of first power semiconductor dies 506. The second branches '3' of the lead frame or clip frame 108 are vertically connected to the source pad 526 of each power semiconductor die 506 included in the second subset 518 of first power semiconductor dies 506. The third branches '5' of the lead frame or clip frame 108 are vertically connected to the source pad 530 of each power semiconductor die 514 included in the first subset 520 of second power semiconductor dies 514. The fourth branches '6' of the lead frame or clip frame 108 are vertically connected to the source pad 530 of each power semiconductor die 514 included in the second subset 522 of second power semiconductor dies 514.

The first structured metal frame 544 of the lead frame or clip frame 108 may include a first additional '7' branch that connects the first branches '2' at a distal end of the first branches '2', and a second additional branch '8' that connects the second branches '3' at a distal end of the second branches '3'. The second structured metal frame 546 of the lead frame or clip frame 108 may include a third additional branch '9' that connects the third branches '5' at a distal end of the third branches '5', and a fourth additional branch '10' that connects the fourth branches '6' at a distal end of the fourth branches '6'.

The first structured metal frame 544 of the lead frame or clip frame 108 may include a first gate metallization '12' disposed in an opening 552 formed in the first central part '1' of the first structured metal frame 544 and that is electrically insulated from the first central part '1', the first branches '2', and the second branches '3'. The first gate metallization '12' is electrically connected to the gate pad 524 of each first power semiconductor die 506, e.g., by bond wires 554. The second structured metal frame 546 of the lead frame or clip frame 108 may include a second gate metallization '14' disposed in an opening 556 formed in the second central part '4' of the second structured metal frame 546 and that is electrically insulated from the second central part '4', the third branches '5', and the fourth branches '6'. The second gate metallization '14' is electrically connected to the gate pad 528 of each second power semiconductor die 514, e.g., by bond wires 558.

The first and second gate metallizations '12', '14' may be part of the lead frame or clip frame 108, as explained above. The first and second gate metallizations '12', '14' instead may be part of respective first and second PCB disposed in the corresponding openings 552, 556 formed in the first central part '1' and the second central part '4' of the lead frame or clip frame 108. In yet another example, the first and second gate metallizations '12', '14' may be part of respective first and second additional power electronics carriers disposed in the corresponding openings 552, 556 formed in the first central part '1' and the second central part '4' of the lead frame or clip frame 108.

A first press-fit pin 560 may be attached to the first gate metallization '12' and protrude through the first side 112 of the electrically insulative enclosure 102. A second press-fit pin 562 may be attached to the second gate metallization '14' and protrude through the first side 112 of the electrically insulative enclosure 102. The power semiconductor module 100 may include additional press-fit pins 564 one or more of which may be attached to the first structured metal frame 544 and/or the second structured metal frame 546 and protruding through the first side 112 of the electrically insulative enclosure 102, e.g., for external current sensing, temperature sensing, etc. The press-fit pins 560, 562, 564 form part of the electrical connection interface 114 of the power semiconductor module 100.

The second structured metal frame 546 of the lead frame or clip frame 108 may include an additional branch '16' at the end of the second central part '4' of the second structured metal frame 546 and that faces the first structured metal frame 544. The additional branch '16' extends in parallel with both the third branches '5' and the fourth branches '6' of the second structured metal frame 546. The additional branch '16' is vertically connected to the metallization layer 502 of the at least one first power electronics carrier 500, e.g., by bumps or stamped features 566 at the backside of additional branch '16', or by solder, electrically conductive adhesive, etc.

In FIG. 11, the metallization layer 502 of the least one first power electronics carrier 500 is electrically connected to the drain pad (out of view) of each first power semiconductor die 506. The metallization layer 510 of the least one second power electronics carrier 508 is electrically connected to the drain pad (out of view) of each second power semiconductor die 514. The first structured metal frame 544 is electrically connected to the source pad 526 of each first power semiconductor die 506. The second structured metal frame 546 is electrically connected to the source pad 530 of each second power semiconductor die 514. The additional branch '16' of the second structured metal frame 546 forms the switch node connection 'SW' between the drain pad of each first power semiconductor die 506 and the source pad 530 of each second power semiconductor die 514.

In FIG. 11, the first high-side phase/power lead 532 and the second high-side phase/power lead 534 are both electrically connected to the metallization layer 510 of the at least one second power electronics carrier 508. The first high-side phase/power lead 532 flanks one side of the first structured metal frame 544 and the second high-side phase/power lead 534 flanks the opposite side of the first structured metal frame 544 as the first high-side phase/power lead 532.

An end of the first structured metal frame 544 may protrude from the first side face 538 of the electrically insulative enclosure 102 to form the low high-side phase/ground lead 536 of the power semiconductor module 100. An end of the second structured metal frame 546 may protrude from the second side face 542 of the electrically insulative enclosure 102 to form the switch node lead 540 of the power semiconductor module 100.

In FIG. 11, the vibration dampeners 120 are attached to the lead frame or clip frame 108 and protrude through the first side 112 of the electrically insulative enclosure 102 separate from the electrical connection interface 114. For example, the vibration dampeners 120 may be the pin-type as shown in FIGS. 1-3 and 5 or of the screw-type as shown in FIG. 7. The vibration dampeners 120 may be soldered, welded, or press-fitted to the lead frame or clip frame 108.

Figure 12:
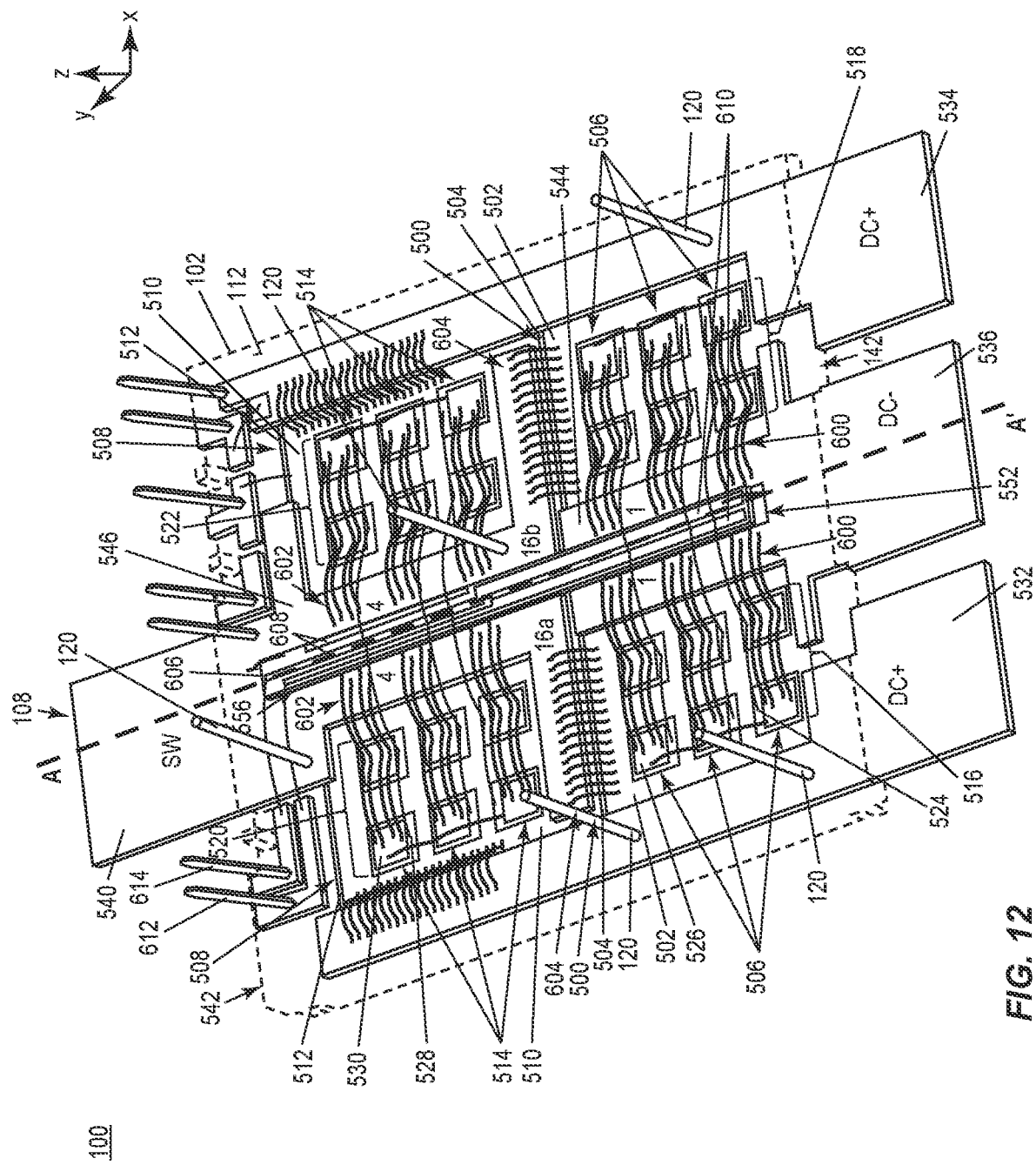
FIG. 12 illustrates a top perspective view of the power semiconductor module, according to another embodiment.

FIG. 12 illustrates a top perspective view of another embodiment of the power semiconductor module 100. According to the embodiment in FIG. 12, the source connections to the first power semiconductor dies 506 are formed by first bond wires 600 which connect the first central part '1' of the first structured metal frame 544 to the source pad 526 of each first power semiconductor die 506. The source connections to the second power semiconductor dies 514 are similarly formed by second bond wires 602 which connect the second central part '4' of the second structured metal frame 546 to the source pad 530 of each second power semiconductor die 514. Accordingly, branches '2', '3', '7' and '8' of the first structured metal frame 544 and branches '5', '6', '9' and '10' of the second structured metal frame 546 are omitted from the lead frame or clip frame 108 and replaced by bond wires 600, 602 in FIG. 12. The additional branch '16' of the second structured metal frame 546 is electrically connected to the metallization layer 502 of the at least one first power electronics carrier 500 by third bond wires 604 in FIG. 12 to complete the switch node connection 'SW'.

In FIG. 12, the gate connections to the power semiconductor dies 506, 514 are provided by at least one PCB 606 disposed in the opening 552 formed in the first central part '1' of the first structured metal frame 544 and in the opening 556 formed in the second central part '4' of the second structured metal frame 546. The at least one PCB 606 has one or more first metal traces 608 electrically connected to the gate pad 524 of each first power semiconductor die 506 and one or more second metal traces 610 electrically connected to the gate pad 528 of each second power semiconductor die 514. The external gate connections may be provided by respective press-fit connectors 612, 614. The at least one PCB 606 may instead by at least one additional power electronics carrier such as a DCB substrate, an AMB substrate, an IMS, etc.

In FIG. 12, the first structured metal frame 544 is wire bonded to the source pad 526 of each first power semiconductor die 506 and the second structured metal frame 546 is wire bonded to the source pad 530 of each second power semiconductor die 514. The additional branch '16' of the second structured metal frame 546 may be divided into two segments '16a', '16b' to accommodate the at least one PCB/power electronics carrier 606 that provides the gate connections to the power semiconductor dies 506, 514. Each segment '16a', '16b' of the additional branch '16' of the second structured metal frame 546 is wire bonded to the metallization layer 502 of a first power electronics carrier 500 to form the switch node connection 'SW' between the drain pad (out of view) of each first power semiconductor die 506 and the source pad 530 of each second power semiconductor die 514.

Although the present disclosure is not so limited, the following numbered examples demonstrate one or more aspects of the disclosure.

Example 1. A power semiconductor module, comprising: an electrically insulative enclosure; a plurality of power semiconductor dies attached to a substrate inside the electrically insulative enclosure; a lead frame or clip frame disposed above the plurality of power semiconductor dies inside the electrically insulative enclosure and electrically connected to the plurality of power semiconductor dies; a plurality of contact pins attached to the lead frame or clip frame and protruding through a first side of the electrically insulative enclosure to form an electrical connection interface outside the electrically insulative enclosure; and a plurality of vibration dampeners attached to the lead frame or clip frame and protruding through the first side of the electrically insulative enclosure separate from the electrical connection interface, wherein the plurality of vibration dampeners is configured to dampen vibrations at a circuit board designed to be mounted to the power semiconductor module and does not affect electrical operation of the power semiconductor module.

Example 2. The power semiconductor module of example 1, wherein the plurality of vibration dampeners comprises a plurality of additional pins attached to the lead frame or clip frame and protruding through the first side of the electrically insulative enclosure.

Example 3. The power semiconductor module of example 2, wherein the plurality of additional pins comprises press-fit pins.

Example 4. The power semiconductor module of example 1, wherein the plurality of vibration dampeners comprises a plurality of screw-type fasteners attached to the lead frame or clip frame and protruding through the first side of the electrically insulative enclosure.

Example 5. The power semiconductor module of any of examples 1 through 4, wherein the power semiconductor dies are electrically interconnected inside the electrically insulative enclosure by the substrate and the lead frame or clip frame to form a low-side switch device and/or high-side switch device of one or more half-bridges.

Example 6. The power semiconductor module of any of examples 1 through 5, wherein part of the lead frame or clip frame protrudes through a first side face of the electrically insulative enclosure to form a power terminal of the power semiconductor module.

Example 7. The power semiconductor module of any of examples 1 through 6, wherein each power semiconductor die has a source pad at a side of the power semiconductor die that faces the lead frame or clip frame, and wherein the lead frame or clip frame provides an electrical connection to the source pad of each power semiconductor die.

Example 8. A power electronics system, comprising: a power semiconductor module that includes an electrically insulative enclosure, a plurality of power semiconductor dies attached to a substrate inside the electrically insulative enclosure, a lead frame or clip frame disposed above the plurality of power semiconductor dies inside the electrically insulative enclosure and electrically connected to the plurality of power semiconductor dies, a plurality of pins attached to the lead frame or clip frame and protruding through a first side of the electrically insulative enclosure to form an electrical connection interface outside the electrically insulative enclosure, and a plurality of vibration dampeners attached to the lead frame or clip frame and protruding through the first side of the electrically insulative enclosure separate from the electrical connection interface; and a circuit board that includes a plurality of electronic components mounted thereon, a plurality of first openings that receive the plurality of pins, and a plurality of second openings that receive the plurality of vibration dampeners, wherein the plurality of vibration dampeners is configured to dampen vibrations at the circuit board and does not affect electrical operation of the power semiconductor module.

Example 9. The power electronics system of example 8, wherein the plurality of vibration dampeners comprises a plurality of additional pins attached to the lead frame or clip frame and protruding through the first side of the electrically insulative enclosure and into the plurality of second openings in the circuit board.

Example 10. The power electronics system of example 9, wherein the plurality of additional pins comprises press-fit pins that form a press-fit connection with the plurality of second openings in the circuit board.

Example 11. The power electronics system of example 9 or 10, wherein the circuit board has a plurality of metal traces that electrically interconnects the plurality of pins of the power semiconductor module to one or more of the electronic components mounted on the circuit board, and wherein the plurality of additional pins is electrically insulated from the plurality of metal traces.

Example 12. The power electronics system of example 8, wherein the plurality of vibration dampeners comprises a plurality of screw-type fasteners attached to the lead frame or clip frame and protruding through the first side of the electrically insulative enclosure to form a screw connection with the plurality of second openings in the circuit board.

Example 13. The power electronics system of example 12, wherein the circuit board has a plurality of metal traces that electrically interconnects the plurality of pins of the power semiconductor module to one or more of the electronic components mounted on the circuit board, and wherein the plurality of screw-type fasteners is electrically insulated from the plurality of metal traces.

Example 14. The power electronics system of any of examples 8 through 13, wherein the power semiconductor dies are electrically interconnected inside the electrically insulative enclosure by the substrate and the lead frame or clip frame to form a low-side switch device and/or high-side switch device of one or more half-bridges, and wherein one or more of the electronic components mounted on the circuit board includes a gate driver for the low-side switch device and/or high-side switch device.

Example 15. The power electronics system of any of examples 8 through 14, wherein part of the lead frame or clip frame protrudes through a first side face of the electrically insulative enclosure to form a power terminal of the power semiconductor module.

Example 16. The power electronics system of any of examples 8 through 15, wherein each power semiconductor die included in the power semiconductor module has a source pad that faces the lead frame or clip frame, and wherein the lead frame or clip frame provides an electrical connection to the source pad of each power semiconductor die.

Example 17. The power electronics system of any of examples 8 through 16, further comprising: a heatsink mounted to a side of the power semiconductor module that faces away from the circuit board.

Terms such as "first", "second", and the like, are used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

The expression "and/or" should be interpreted to include all possible conjunctive and disjunctive combinations, unless expressly noted otherwise. For example, the expression "A and/or B" should be interpreted to mean only A, only B, or both A and B. The expression "at least one of" should be interpreted in the same manner as "and/or", unless expressly noted otherwise. For example, the expression "at least one of A and B" should be interpreted to mean only A, only B, or both A and B.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A power semiconductor module, comprising:
an electrically insulative enclosure;
a plurality of power semiconductor dies attached to a substrate inside the electrically insulative enclosure;
a lead frame or clip frame disposed above the plurality of power semiconductor dies inside the electrically insulative enclosure and electrically connected to the plurality of power semiconductor dies;
a plurality of contact pins attached to the lead frame or clip frame and protruding through a first side of the electrically insulative enclosure to form an electrical connection interface outside the electrically insulative enclosure; and
a plurality of vibration dampeners attached to the lead frame or clip frame and protruding through the first side of the electrically insulative enclosure separate from the electrical connection interface,
wherein the plurality of vibration dampeners is configured to dampen vibrations at a circuit board designed to be mounted to the power semiconductor module and does not affect electrical operation of the power semiconductor module.

2. The power semiconductor module of claim 1, wherein the plurality of vibration dampeners comprises a plurality of additional pins attached to the lead frame or clip frame and protruding through the first side of the electrically insulative enclosure.

3. The power semiconductor module of claim 2, wherein the plurality of additional pins comprises press-fit pins.

4. The power semiconductor module of claim 1, wherein the plurality of vibration dampeners comprises a plurality of screw-type fasteners attached to the lead frame or clip frame and protruding through the first side of the electrically insulative enclosure.

5. The power semiconductor module of claim 1, wherein the power semiconductor dies are electrically interconnected inside the electrically insulative enclosure by the substrate and the lead frame or clip frame to form a low-side switch device and/or high-side switch device of one or more half-bridges.

6. The power semiconductor module of claim 1, wherein part of the lead frame or clip frame protrudes through a first side face of the electrically insulative enclosure to form a power terminal of the power semiconductor module.

7. The power semiconductor module of claim 1, wherein each power semiconductor die has a source pad at a side of the power semiconductor die that faces the lead frame or clip frame, and wherein the lead frame or clip frame provides an electrical connection to the source pad of each power semiconductor die.

8. A power electronics system, comprising:
a power semiconductor module that includes an electrically insulative enclosure, a plurality of power semiconductor dies attached to a substrate inside the electrically insulative enclosure, a lead frame or clip frame disposed above the plurality of power semiconductor dies inside the electrically insulative enclosure and electrically connected to the plurality of power semiconductor dies, a plurality of pins attached to the lead frame or clip frame and protruding through a first side of the electrically insulative enclosure to form an electrical connection interface outside the electrically insulative enclosure, and a plurality of vibration dampeners attached to the lead frame or clip frame and protruding through the first side of the electrically insulative enclosure separate from the electrical connection interface; and
a circuit board that includes a plurality of electronic components mounted thereon, a plurality of first openings that receive the plurality of pins, and a plurality of second openings that receive the plurality of vibration dampeners,
wherein the plurality of vibration dampeners is configured to dampen vibrations at the circuit board and does not affect electrical operation of the power semiconductor module.

9. The power electronics system of claim 8, wherein the plurality of vibration dampeners comprises a plurality of additional pins attached to the lead frame or clip frame and protruding through the first side of the electrically insulative enclosure and into the plurality of second openings in the circuit board.

10. The power electronics system of claim 9, wherein the plurality of additional pins comprises press-fit pins that form a press-fit connection with the plurality of second openings in the circuit board.

11. The power electronics system of claim 9, wherein the circuit board has a plurality of metal traces that electrically interconnects the plurality of pins of the power semiconductor module to one or more of the electronic components mounted on the circuit board, and wherein the plurality of additional pins is electrically insulated from the plurality of metal traces.

12. The power electronics system of claim 8, wherein the plurality of vibration dampeners comprises a plurality of screw-type fasteners attached to the lead frame or clip frame and protruding through the first side of the electrically insulative enclosure to form a screw connection with the plurality of second openings in the circuit board.

13. The power electronics system of claim 12, wherein the circuit board has a plurality of metal traces that electrically interconnects the plurality of pins of the power semiconductor module to one or more of the electronic components mounted on the circuit board, and wherein the plurality of screw-type fasteners is electrically insulated from the plurality of metal traces.

14. The power electronics system of claim 8, wherein the power semiconductor dies are electrically interconnected inside the electrically insulative enclosure by the substrate and the lead frame or clip frame to form a low-side switch device and/or high-side switch device of one or more half-bridges, and wherein one or more of the electronic components mounted on the circuit board includes a gate driver for the low-side switch device and/or high-side switch device.

15. The power electronics system of claim 8, wherein part of the lead frame or clip frame protrudes through a first side face of the electrically insulative enclosure to form a power terminal of the power semiconductor module.

16. The power electronics system of claim 8, wherein each power semiconductor die included in the power semiconductor module has a source pad that faces the lead frame or clip frame, and wherein the lead frame or clip frame provides an electrical connection to the source pad of each power semiconductor die.

17. The power electronics system of claim 8, further comprising:
a heatsink mounted to a side of the power semiconductor module that faces away from the circuit board.

* * * * *